AMPLIFIER HAVING VARIABLE CHARACTERISTICS

Filed Jan. 8, 1954 2 Sheets-Sheet 1

INVENTOR:
GEORGES COMTE
MAX BOUDERLIQUE
BY: [signature]

INVENTOR:
GEORGES COMTE
MAX BOUDELIQUE
BY: [signature]

United States Patent Office 2,801,301 Patented July 30, 1957

2,801,301

AMPLIFIER HAVING VARIABLE CHARACTERISTICS

Georges Comte, Lyon, and Max Bouderlique, Caluire, France, assignors to Compagnie Generale d'Electricite, Paris, France, a corporation of France Application January 8, 1954, Serial No. 403,017

Claims priority, application France January 8, 1953

7 Claims. (Cl. 179—171)

In many cases, particularly when it is desired to compensate for the variations of the magnitude of an electrical signal, the characteristics of which vary as a function of time, it is desirable to have an amplifier with gain and dephasing characteristics which themselves vary as a function of the frequency and as a function of time, in accordance with a corresponding law.

Such a case arises, for example, when an electrical pulse is applied to the input of a line having impedance irregularities. The echo-voltages produced by the reflection in the line are attenuated and distorted in phase, which attenuation and phase distortion is to be measured. As a consequence of the transmission distortion of the line, the various spectral components making up these echo-voltages are attenuated a greater amount the higher their frequency and the farther the irregularities which produce them are away from the input of the line. The amplifier used for receiving these echoes must therefore have a higher gain for the high frequencies, in comparison to the gain at the mean and low frequencies this is particularly true the longer the time elapsed from the transmission of the pulse to the input of the line.

The object of the present invention is an amplifier of this type, including at least one amplifier tube provided with an inverse feed-back circuit, and which is characterised in, that the inverse feed-back circuit comprises an auxiliary tube with several electrodes, one electrode of which is connected to a generator supplying a voltage which varies as a function of the time, in accordance with a predetermined law, so that the internal impedance between certain electrodes of the auxiliary tube and consequently the gain of the amplifier tube varies as a function of this voltage.

The attached drawings represent by way of non-limiting examples, various embodiments of the amplifier according to the invention;

Figure 1:
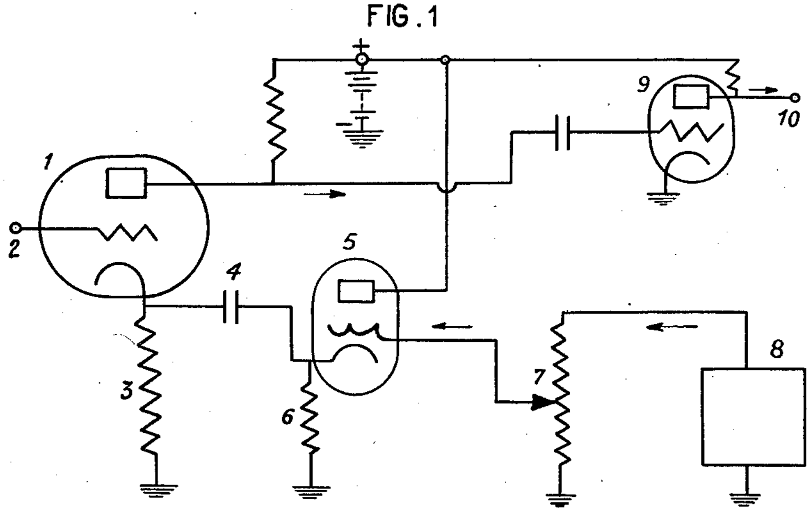
Fig. 1 is a schematic circuit diagram of an amplifier in which the apparent resistance between the cathode of the auxiliary tube and ground is employed as a variable element of the inverse feed-back circuit.
Figure 2:
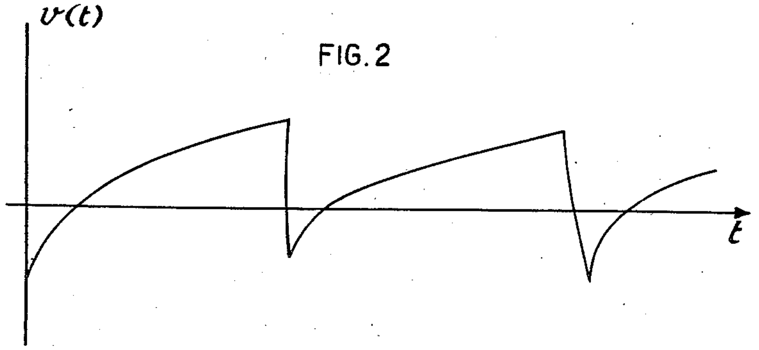
Fig. 2 is a diagram showing a possible wave form of periodic variation of the voltage supplied by the generator of Fig. 1.

In Fig. 1, 1 represents the amplified tube, to the control grid of which the voltage to be amplified is applied through the terminal 2.

In the cathode circuit of this tube, an inverse feed-back circuit is inserted, which comprises a fixed resistor 3, connected between the cathode and ground, a condenser 4, connected between the cathode of the tube 1 and the cathode of an auxiliary tube 5 and a resistor 6 connected between the cathode of the tube 5 and ground.

To the control grid of the auxiliary tube 5 is applied by means of a regulating potentiometer 7, the voltage output of a generator 8, the form of this voltage varying as a function of time in accordance with a predetermined law.

The anode of the tube 1 is connected through a connecting condenser to the control grid of a tube 9 which constitutes a second stage of amplification.

The amplified voltage is collected on the terminal 10, connected to the anode of the tube 9.

The operation of this device is as follows:

The control grid bias voltage of the tube 5 follows the variations of the output voltage of the generator 8. This bias voltage causes the slope of the tube 5 to vary and consequently the value of the apparent resistance between the cathode and earth of said tube the latter resistance is in effect only equal to the resistance 6 when tube is not operating.

This resistance-variation in turn involves a variation of the gain of the tube 1, which thus depends finally upon the voltage output from the generator 8.

Figure 3:
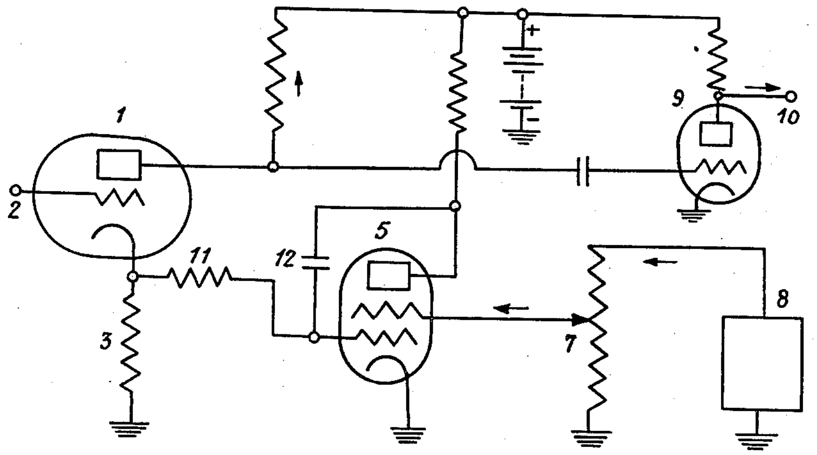
Fig. 3 is a schematic circuit diagram of an amplifier in which the variable element is composed of the grid-to-ground capacitance of the auxiliary tube; and finally

Fig. 3 represents another apparatus for carrying out the method according to the present invention, in which the inverse feed-back-circuit comprises a fixed resistor 11, connected between the cathode of the tube 1 and the control grid of the auxiliary tube 5, and a condenser 12 connecting said grid to the anode of the tube 5. The variable inverse feed-back effect is then obtained, as a function of the voltage applied to the screen grid or to the cathode of the tube 5, by the variation of the grid-to-ground capacity of said tube.

Figure 4:
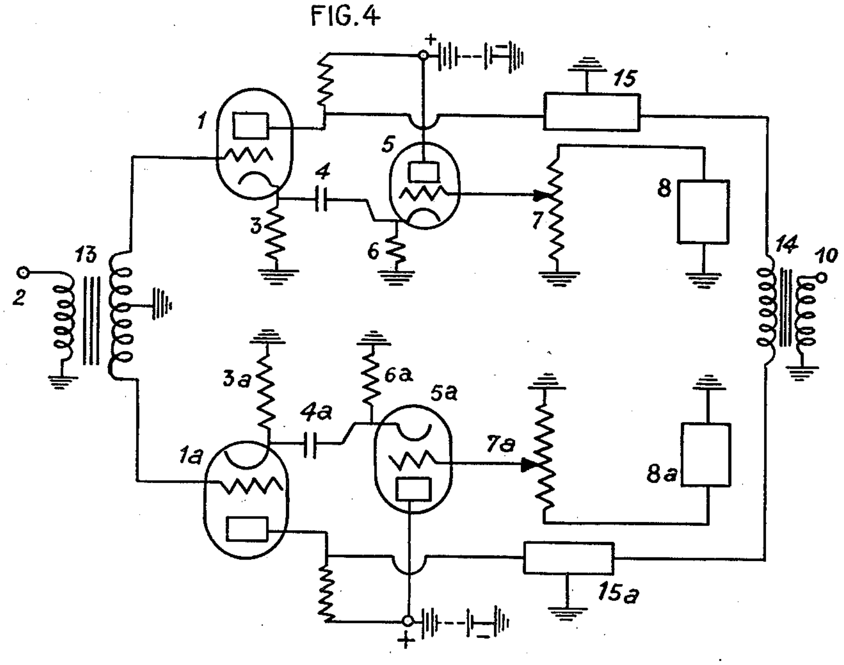
Fig. 4 is a schematic circuit diagram of an amplifier with two tubes symmetrically mounted, each of the tubes comprising an inverse feed-back circuit such as that shown in Fig. 1.

Finally, Fig. 4 represents a device according to the invention, comprising two amplifier assemblies similar to that of Fig. 1, symmetrically arranged. The voltage to be amplified is applied to the terminal 2 and from there to the primary winding of a transformer 13, having a secondary winding the ends of which are respectively connected to the control grids of two tubes 1 and 1*a*, carrying out the same function as in the device according to Fig. 1. The amplified voltage is collected on the input of a transformer 14 connected to the anodes of said tubes by means of filters 15, 15*a*, which prevent the control voltage supplied by the generators 8 and 8*a*, or a harmonic of this voltage, from being superimposed on the voltage collected on the primary of the transformer 14, and thus appearing again on the input of the next amplifier stage.

What is claimed is:

1. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharge device; and generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage.

2. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharge device; generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage; and voltage varying means connected between said generating means and said screen electrode of said second electron discharge device.

3. In a variable gain amplifier, in combination, a first electron discharge device having at least a cathode, an anode, and a control electrode, said control electrode being adapted to have applied thereto voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharge device; generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage; and a potentiometer connected between said generating means and said screen electrode of said second electron discharge device.

4. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharge device; generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage; and amplifying means connected to the anode of said first electron discharge device for further amplifying any voltage amplified by said first electron discharge device.

5. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharge device; generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage; and a third electron discharge device having at least a cathode, an anode and a control electrode; and a capacitor connected between the anode of said first electron discharge device and the control electrode of said third electron discharge device for coupling any voltage amplified by said first electron discharge device to the control electrode of said third electron discharge device wherein said amplified voltage is further amplified 6. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit connected between said cathode of said first electron discharge device and said control electrode of said second electron discharging device; generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage; a potentiometer connected between said generating means and said screen electrode of said second electron discharge device; and amplifying means connected to the anode of said first electron discharge device for further amplifying any voltage amplified by said first electron discharge device.

7. In a variable gain amplifier, in combination, a first electron discharge device having at least a cathode, an anode, and a control electrode, said control electrode being adapted to have applied thereto a voltage to be amplified; a second electron discharge device having at least a cathode, an anode, a control electrode and a screen electrode; a capacitor connected between said control electrode of said second discharge device and the anode thereof; a negative feedback circuit including a resistor connected between said cathode of said first electron discharge device and said control electrode of said second electron discharging device; and generating means for providing an alternating current voltage connected in circuit with said screen electrode of said second electron discharge device thereby varying the internal impedance of said second electron discharge device and the gain of said first electron discharge device in accordance with the amplitude and frequency of said alternating current voltage.

References Cited in the file of this patent

UNITED STATES PATENTS

| | | |
|---|---|---|
| 2,162,878 | Brailsford | June 20, 1939 |
| 2,428,039 | Royden | Sept. 30, 1947 |
| 2,475,258 | Scott | July 5, 1949 |

FOREIGN PATENTS

| | | |
|---|---|---|
| 653,505 | Great Britain | May 16, 1957 |